United States Patent
Cho

(10) Patent No.: US 9,246,095 B2
(45) Date of Patent: Jan. 26, 2016

(54) ELECTRONIC DEVICE INCLUDING A MEMORY

(71) Applicant: SK HYNIX INC., Icheon (KR)

(72) Inventor: Kwang-Hee Cho, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/280,579

(22) Filed: May 17, 2014

(65) Prior Publication Data

US 2015/0134858 A1 May 14, 2015

(30) Foreign Application Priority Data

Nov. 12, 2013 (KR) .................. 10-2013-0137044

(51) Int. Cl.
*H01L 21/70* (2006.01)
*H01L 45/00* (2006.01)
*G06F 3/06* (2006.01)

(52) U.S. Cl.
CPC .............. *H01L 45/14* (2013.01); *G06F 3/061* (2013.01); *G06F 3/067* (2013.01); *G06F 3/0659* (2013.01); *H01L 45/1253* (2013.01); *H01L 45/147* (2013.01)

(58) Field of Classification Search
CPC .. H01L 45/00; H01L 45/1206; H01L 45/1683
See application file for complete search history.

(56) References Cited

U.S. PATENT DOCUMENTS

| 5,392,442 | A | * | 2/1995 | Komori | F16B 13/0808 712/201 |
| 5,557,769 | A | * | 9/1996 | Bailey | G06F 12/0835 711/146 |
| 8,796,660 | B2 | * | 8/2014 | Takagi | H01L 27/101 257/2 |
| 2008/0080240 | A1 | * | 4/2008 | Lee | G11C 7/10 365/185.08 |
| 2010/0312958 | A1 | * | 12/2010 | Sakai | G06F 11/0727 711/112 |
| 2013/0285006 | A1 | * | 10/2013 | Park | H01L 45/1206 257/5 |
| 2013/0321373 | A1 | * | 12/2013 | Yoshizumi | G09G 5/00 345/211 |
| 2014/0042383 | A1 | * | 2/2014 | Inokuma | H01L 45/1608 257/4 |

FOREIGN PATENT DOCUMENTS

KR 10-2011-0085654 A 7/2011

* cited by examiner

*Primary Examiner* — William F Kraig
*Assistant Examiner* — Khatib Rahman

(57) ABSTRACT

An electronic device includes a semiconductor memory unit that includes a vertical electrode formed over a substrate and receiving a voltage through one end of the vertical electrode, a resistance variable layer formed along a side of the vertical electrode to be thinner going from one end to the other end, and a plurality of horizontal electrodes formed adjacent to the vertical electrode with the resistance variable layer disposed between the horizontal electrodes and the vertical electrode, and stacked over the substrate with a space from each other.

16 Claims, 8 Drawing Sheets

ELECTRONIC DEVICE INCLUDING A MEMORY

CROSS-REFERENCE TO RELATED APPLICATIONS

The present application claims priority to Korean Patent Application No. 10-2013-0137044, entitled "ELECTRONIC DEVICE" and filed on Nov. 12, 2013, which is incorporated herein by reference in its entirety.

TECHNICAL FIELD

Embodiments of the present disclosure relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as computers, portable communication devices, and so on, have been sought in the art, and research has been conducted for applicable semiconductor devices. Such semiconductor devices include semiconductor devices which can store data using a resistance variable material (that is, a material that can be switched between different resistance states according to a voltage or current applied thereto). For example, semiconductor devices include resistive random access memory (RRAM) devices, phase change random access memory (PRAM) devices, ferroelectric random access memory (FRMA) devices, magnetic random access memory (MRAM) devices, E-fuses, and the like.

SUMMARY

Embodiments of the present disclosure relate to memory circuits or devices and their applications in electronic devices or systems, and various embodiments of an electronic device in which a plurality of memory cells of a semiconductor memory unit that are vertically stacked may be driven with a more uniform operation electric field strength, even though the memory cells are disposed at a plurality of distances from an operation voltage supplying end.

In an embodiment, an electronic device includes a semiconductor memory unit that includes: a vertical electrode formed over a substrate and receiving a voltage through a first end of the vertical electrode; a resistive variable layer formed along a side of the vertical electrode to be thinner going from the first end to a second end; and a plurality of horizontal electrodes formed adjacent to the vertical electrode with the resistive variable layer disposed between the horizontal electrodes and the vertical electrode, and stacked over the substrate separated from each other.

The resistive variable layer may include one or more layers each of a material selected from the group consisting of a perovskite-based oxide, a transition metal oxide, and a chalcogenide compound.

The semiconductor memory unit may further include: a conductive layer formed to be coupled to the first end of the vertical electrode and applying a voltage.

The semiconductor memory unit may further include: an insulation layer formed between the multiple horizontal electrodes that are separated from each other.

In an embodiment, an electronic device includes a semiconductor memory unit that includes: a vertical electrode formed over a substrate and receiving a voltage through a first end of the vertical electrode; a first horizontal electrode disposed adjacent to the first end of the vertical electrode; a second horizontal electrode disposed adjacent to a second end of the vertical electrode; a first resistive variable layer interposed between the vertical electrode and the first horizontal electrode and having a first thickness; and a second resistive variable layer interposed between the vertical electrode and the second horizontal electrode and having a second thickness that is thinner than the first thickness.

Each of the first and second resistive variable layers may include one or more layers each of a material selected from the group consisting of a perovskite-based oxide, a transition metal oxide, and a chalcogenide compound.

The semiconductor memory unit may further include: a conductive layer formed to be coupled to the first end of the vertical electrode and applying a voltage.

The electronic device may further include a microprocessor that includes a control unit configured to receive a signal including a command from an outside of the microprocessor, and performs extracting, decoding of the command, or controlling input or output of a signal of the microprocessor; an operation unit configured to perform an operation based on a result that occurs when the control unit decodes the command; and a memory unit configured to store data for performing the operation, data corresponding to a result of performing the operation, or an address of data for which the operation is performed, wherein the semiconductor memory unit is part of the memory unit in the microprocessor.

The electronic device may further include a processor that includes a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit is part of the auxiliary memory device or the main memory device in the processing system.

The electronic device may further include a data storage system that includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory unit is part of the storage device or the temporary storage device in the data storage system.

The electronic device may further include a memory system that includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory unit that is part of the memory or the buffer memory in the memory system.

These and other aspects, implementations and associated advantages will become apparent in view of the drawings and the description of embodiments provided herein, which are intended to provide further explanation of the invention as claimed.

DETAILED DESCRIPTION

Figure 1:
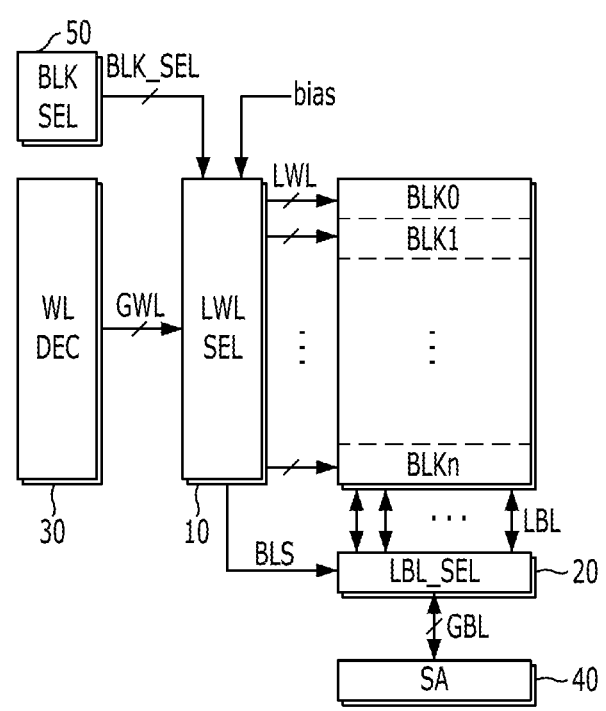
FIG. 1 is a block view illustrating a semiconductor memory unit

Various embodiments of the present disclosure are described below in detail with reference to the accompanying drawings. The drawings may not be necessarily to scale and in some instances, proportions of at least some structures in the drawings may be exaggerated in order to clearly illustrate certain features of the described embodiments. In presenting a specific embodiment in a drawing or description having two or more layers in a multi-layer structure, the relative positioning relationship of such layers or the sequence of arranging the layers as shown reflects a particular implementation for the described or illustrated embodiment and a different relative positioning relationship or sequence of arranging the layers may be possible. In addition, a described or illustrated embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a block view illustrating a semiconductor memory unit. The semiconductor memory unit includes a plurality of memory blocks BLK0 to BLKn, a plurality of local word line selectors LWL SEL 10, a plurality of local bit line selectors LBL_SEL 20, a word line decoder WL DEC 30, a sense amplifier SA 40, and a block selection circuit BLK SEL 50.

Each of the memory blocks BLK0 to BLKn includes a plurality of local word lines LWL, a plurality of local bit lines LBL, and a plurality of memory cells. The memory blocks BLK0 to BLKn may be coupled with the local word line selectors LWL SEL 10 and the local bit line selectors LBL_SEL 20 via the plurality of local word lines LWL and the plurality of local bit lines LBL, respectively.

The local word line selectors LWL SEL 10 couple local word lines LWL of a selected memory block with global word lines GWL coupled to the word line decoder WL DEC 30 in response to a block selection signal BLK_SEL. The local word line selectors LWL SEL 10 may transfer a bit line selection signal BLS to the local bit line selectors LBL_SEL 20 so that the local bit line selectors LBL_SEL 20 are activated in response to the bit line selection signal BLS.

The local bit line selectors LBL_SEL 20 couple local bit lines LBL of the selected memory block with global bit lines GBL coupled to the sense amplifier SA 40 in response to the bit line selection signal BLS.

The local bit line selectors LBL_SEL 20 may include bit line selection transistors. Each of the bit line selection transistors may include a gate electrode, a source electrode, and a drain electrode, and the source electrode and the drain electrode may be coupled with a local bit line LBL and a global bit line GBL, respectively. The gate electrodes may be coupled with a bit line selection signal BLS in common.

A plurality of local word line selectors LWL SEL 10 may be coupled to a single word line decoder WL DEC 30, and a plurality of local bit line selectors LBL_SEL 20 may be coupled to a single sense amplifier SA 40.

The word line decoder WL DEC 30 selects one among the global word lines GWL by decoding an external address. The number of global word lines GWL provided may be as many as the number of the local word lines LWL included in one memory block. The word line decoder WL DEC 30 is coupled with the memory blocks BLK0 to BLKn in common, and the word line decoder WL DEC 30 provides data information to the local word lines LWL coupled with the selected memory block in response to the block selection signal BLK_SEL. As a result, the local word lines LWL of each of the memory blocks BLK0 to BLKn may be selected based on the same address information.

The sense amplifier SA 40 may sense data read out of memory cells during a read operation. In addition, the sense amplifier SA 40 may temporarily store data to be stored in memory cells during a write operation. The sense amplifier SA 40 may be coupled with the memory blocks BLK0 to BLKn in common, and the sense amplifier SA 40 may sense data read out of memory cells of a memory block selected by the block selection circuit BLK SEL 50.

The block selection circuit BLK SEL 50 generates the block selection signal BLK_SEL for selecting one of the memory blocks BLK0 to BLKn, based on address information (not shown). The local word lines LWL and the local bit lines LBL of the selected memory block are coupled with the corresponding global word lines GWL and the corresponding global bit lines GBL, respectively.

The plurality of memory blocks BLK0 to BLKn as shown in FIG. 1 may share the global bit lines GBL. The global bit lines GBL may be coupled with the sense amplifier SA 40. The local bit lines LBL are coupled with the respective global bit lines GBL.

FIGS. 2 to 5 show diverse three-dimensional stack structures of a semiconductor memory unit in accordance with embodiments of the present disclosure.

In an embodiment, a semiconductor memory unit includes a resistive random access memory (RRAM) device that stores data based on a change in a resistance value, however, embodiments are not limited to it.

Figure 2:
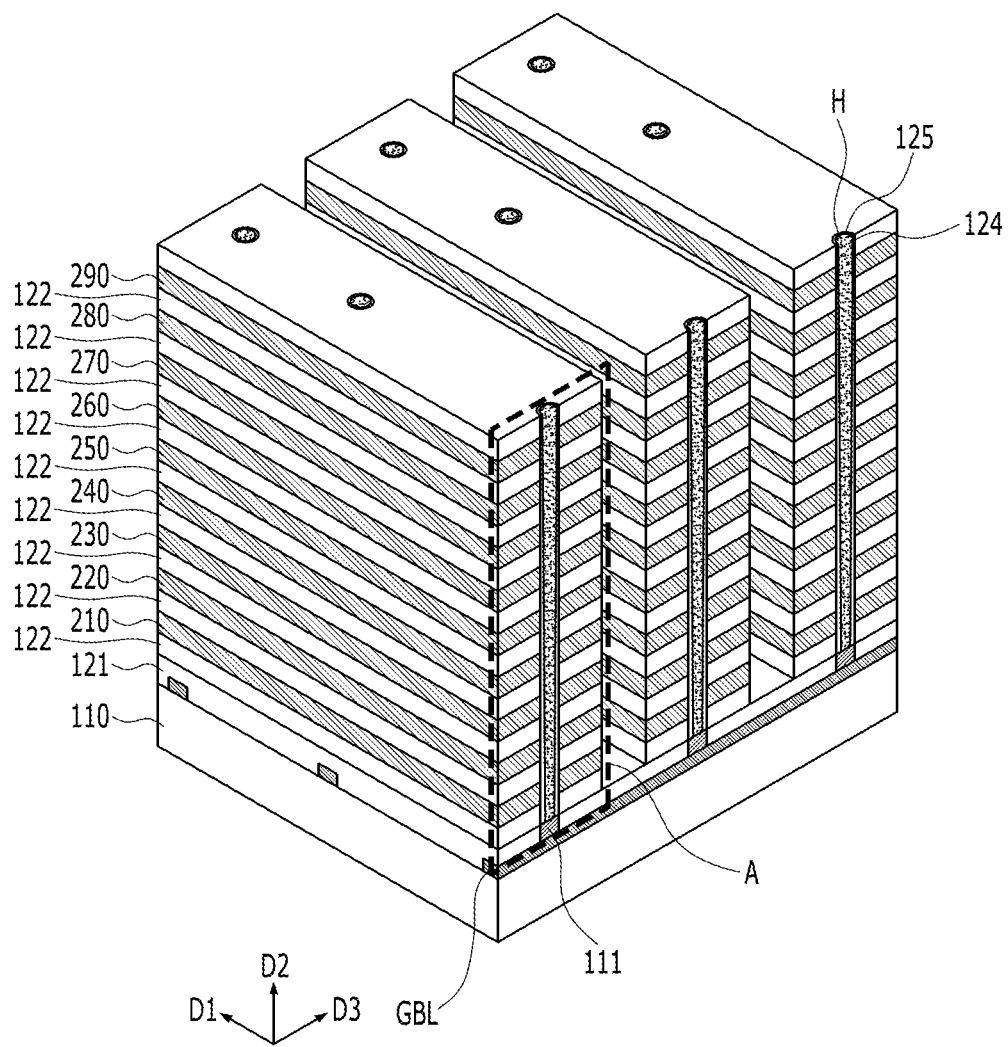
FIG. 2 is a perspective view of a semiconductor memory unit in accordance with a first embodiment of the present disclosure.

FIG. 2 is a perspective view of a semiconductor memory unit in accordance with a first embodiment of the present disclosure. The semiconductor memory unit includes a plurality of memory blocks, which may correspond to the memory blocks BLK0 to BLKn of FIG. 1. Each of the memory blocks BLK0 to BLKn may extend in first to third directions D1, D2 and D3. The first to third directions D1, D2 and D3 may be different from each other, as illustrated in FIG. 2. In an embodiment, the first to third directions D1, D2 and D3 may intersect each other at right angles, but embodiments are not limited to it.

The semiconductor memory unit may include a semiconductor substrate 110, and a plurality of conductive layers 111, a plurality of insulation layers 122, a plurality of horizontal electrodes 210 to 290 (horizontal meaning in a direction substantially parallel to a proximate surface of the semiconductor substrate 110), a plurality of vertical electrodes 124 (vertical meaning in a direction substantially orthogonal to the proximate surface of the semiconductor substrate 110), and a plurality of resistance variable layers 125 that are formed over the semiconductor substrate 110.

Global bit lines GBL may be disposed over the semiconductor substrate 110. The global bit lines GBL may include impurity regions that are formed by doping active regions with an impurity. The active regions may be bounded by isolation patterns in the inside of the semiconductor substrate 110.

Each of the conductive layers 111 may be formed over the semiconductor substrate 110 so as to be coupled with a first end of each of the vertical electrodes 124. The conductive layers 111 may supply an operation voltage to the respective vertical electrodes 124. Also, the conductive layers 111 may be disposed within an inter-layer dielectric layer 121.

The insulation layers 122 may be sequentially stacked over the semiconductor substrate 110 by being separated from each other along the second direction D2. As illustrated in FIG. 2, each of the insulation layers 122 may be formed extending in the first direction D1.

The horizontal electrodes 210 to 290 may be formed extending in the first direction D1. To be specific, the horizontal electrodes 210 to 290 are formed between the stacked insulation layers 122, and the horizontal electrodes 210 to 290 may be coupled with the resistance variable layers 125.

The vertical electrodes 124 may be formed extending in the second direction D2. To be specific, the vertical electrodes 124 are formed within penetration holes H which penetrate through the horizontal electrodes 210 to 290 and the insulation layers 122. The vertical electrodes 124 may be formed in the shape of pillars. The vertical electrodes 124 penetrate through the horizontal electrodes 210 to 290 and the insulation layers 122 to be coupled with the conductive layers 111.

The vertical electrodes 124 arrayed in the third direction D3 may be electrically coupled to each other through the global bit lines GBL. In other words, the vertical electrodes 124 arrayed in the third direction D3 may share the global bit lines GBL.

Meanwhile, the horizontal electrodes 210 to 290 arrayed in the second direction D2 may share the vertical electrodes 124 and the resistance variable layers 125 with each other.

The vertical electrodes 124 and the horizontal electrodes 210 to 290 may include a material selected from the group consisting of Ruthenium (Ru), Ruthenium Dioxide ($RuOx_2$), Titanium/Titanium Nitride (Ti/TiN), Zirconium/Titanium Nitride (Zr/TiN), Nickel Silicide (NiSix), Titanium Nitride (TiN), Tungsten Nitride (WN), Tungsten (W), Aluminum (Al), Copper (Cu), and an alloy thereof, but embodiments are not limited to it.

Meanwhile, although not illustrated in the drawing, the vertical electrodes 124 and the horizontal electrodes 210 to 290 may be formed including a dual structure of a conductive layer and an anti-diffusion layer. To be specific, the vertical electrodes 124 and the horizontal electrodes 210 to 290 may include a dual structure of a conductive layer, which is formed of a conductive substance, and an anti-diffusion layer for preventing the conductive substance from diffusing.

The resistance variable layers 125 may be disposed between the vertical electrodes 124 and the horizontal electrodes 210 to 290. The resistance variable layers 125 may be formed in parallel with the vertical electrodes 124 in the second direction D2 along the sides of the vertical electrodes 124. The resistance variable layers 125 may contain a metal oxide. The metal oxide may include a transition metal oxide (TMO), a perovskite-based oxide, or the like.

The resistance variable layers 125 may include a phase-changing material having resistance variable characteristics. The phase-changing material may include a chalcogen compound.

Meanwhile, although FIG. 2 shows the resistance variable layers 125 to be a single layer, the resistance variable layers 125 may have a multi-layer structure, such as a double layer structure or a triple layer structure if necessary.

Also, the resistance variable layers 125 in accordance with the first embodiment of the present disclosure may become thinner as the resistance variable layers 125 extend away from the conductive layers 111 in the second direction D2.

To be specific, the resistance variable layers 125 may be formed on the side of the vertical electrodes 124 with a predetermined slope. The resistance variable layers 125 each have a first thickness disposed adjacent to the conductive layers 111, and corresponding second thicknesses of the resistance variable layers 125 that are successively smaller than the first thickness according to the distance of each second thickness from the conductive layers 111. Herein, the conductive layers 111 transfer an external voltage to the resistance variable layers 125.

Figure 3:
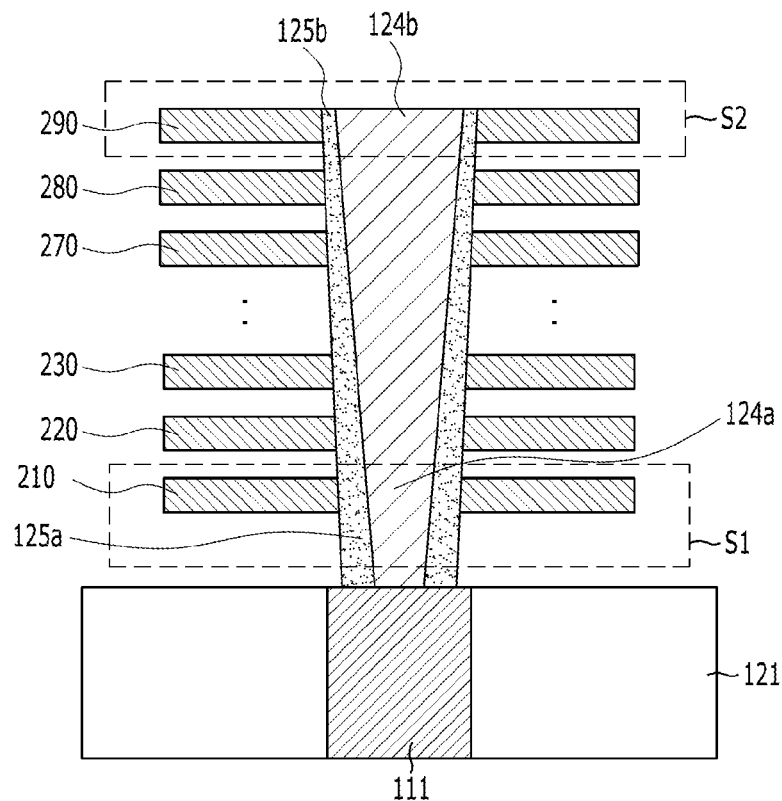
FIG. 3 is a cross-sectional view illustrating a portion "A" shown in FIG. 2 in accordance with an embodiment of the present disclosure.

FIG. 3 is a cross-sectional view illustrating a portion "A" shown in FIG. 2 in accordance with an embodiment of the present disclosure.

Referring to FIG. 3, a lowermost memory cell S1 and an uppermost memory cell S2 are illustrated. The lowermost memory cell S1 is formed adjacent to the conductive layer 111. In other words, the lowermost memory cell S1 is a memory cell disposed in the region where an external voltage is applied. The conductive layers 111 may be formed within the inter-layer dielectric layer 121 formed over the substrate (see FIG. 2), and the conductive layers 111 may provide the vertical electrodes 124 with the external voltage. The lowermost memory cell S1 may include a lowermost vertical electrode portion 124a, a lowermost horizontal electrode 210, and a lowermost resistance variable layer portion 125a disposed between the lowermost vertical electrode portion 124a and the lowermost horizontal electrode 210.

The uppermost memory cell S2 may be a cell disposed farthest from the conductive layers 111. The uppermost memory cell S2 may include an uppermost vertical electrode portion 124b, an uppermost horizontal electrode 290, and an uppermost resistance variable layer portion 125b disposed between the uppermost vertical electrode portion 124b and the uppermost horizontal electrode 290.

The lowermost resistance variable layer portion 125a of the lowermost memory cell S1 may be thicker than the uppermost resistance variable layer portion 125b of the uppermost memory cell S2.

Also, the thickness of the uppermost vertical electrode portion 124b and the thickness of the lowermost vertical electrode portion 124a may be uniform or may vary according to how a semiconductor memory unit is designed, and there is no constraint on the thicknesses of the uppermost vertical electrode portion 124b and the lowermost vertical electrode portion 124a.

Figure 4:
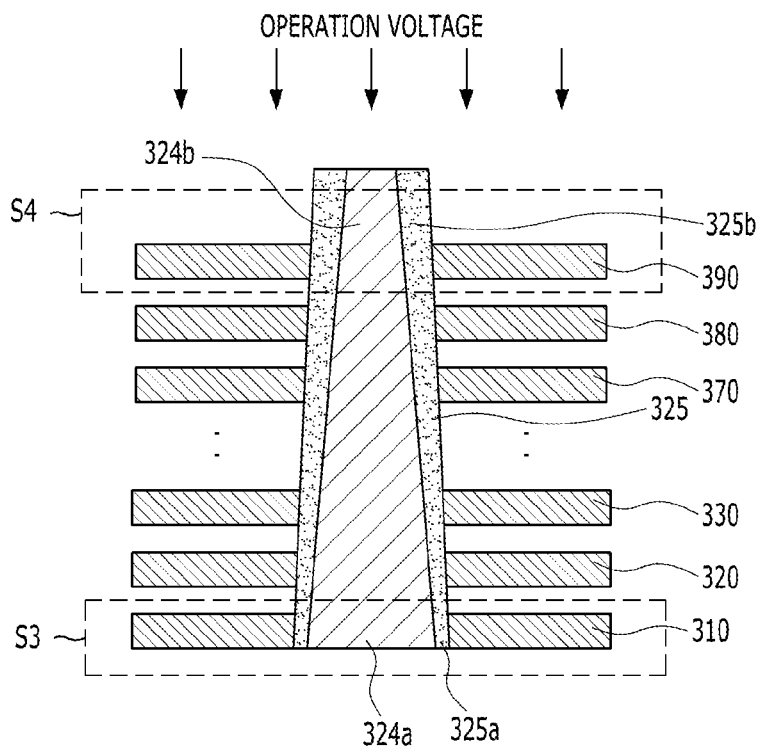
FIG. 4 is a cross-sectional view illustrating the portion "A" shown in FIG. 2 in accordance with another embodiment of the present disclosure.

FIG. 4 is a cross-sectional view illustrating the portion "A" shown in FIG. 2 in accordance with another embodiment of the present disclosure. In the semiconductor memory device of FIG. 4, a voltage is applied in the opposite direction compared to the semiconductor memory device of FIG. 3.

Referring to FIG. 4, an uppermost memory cell S4 and a lowermost memory cell S3 are illustrated.

The uppermost memory cell S4 may be a memory cell disposed in the region where an operation voltage is applied. The uppermost memory cell S4 may include an uppermost vertical electrode portion 324b, an uppermost horizontal electrode 390, and an uppermost resistance variable layer portion 325b disposed between the uppermost vertical electrode portion 324b and the uppermost horizontal electrode 390.

The lowermost memory cell S3 is a memory cell that is disposed farthest from the region where the operation voltage is applied. The lowermost memory cell S3 may include a lowermost vertical electrode portion 324a, a lowermost horizontal electrode 310, and a lowermost resistance variable layer portion 325a disposed between the lowermost vertical electrode portion 324a and the lowermost horizontal electrode 310. The lowermost resistance variable layer portion 325a of the lowermost memory cell S3 may be thinner than the uppermost resistance variable layer portion 325b of the uppermost memory cell S4.

As shown above, the direction that the thickness of the resistance variable layer increases may be different according to where a voltage is applied.

With the structure of the resistance variable layers 125 and 325 according to the embodiments of the present disclosure, it is possible to solve the problem of malfunction caused by a voltage drop which may occur as a result of portions of the resistance variable layers 125 and 325 being disposed far from a voltage supplying end. Also, although there is distance between each memory cell and the voltage supplying end, the memory cells may be driven with a more uniform operation electric field strength in a semiconductor memory unit having a structure where a plurality of memory cells are stacked vertically.

Figure 5:
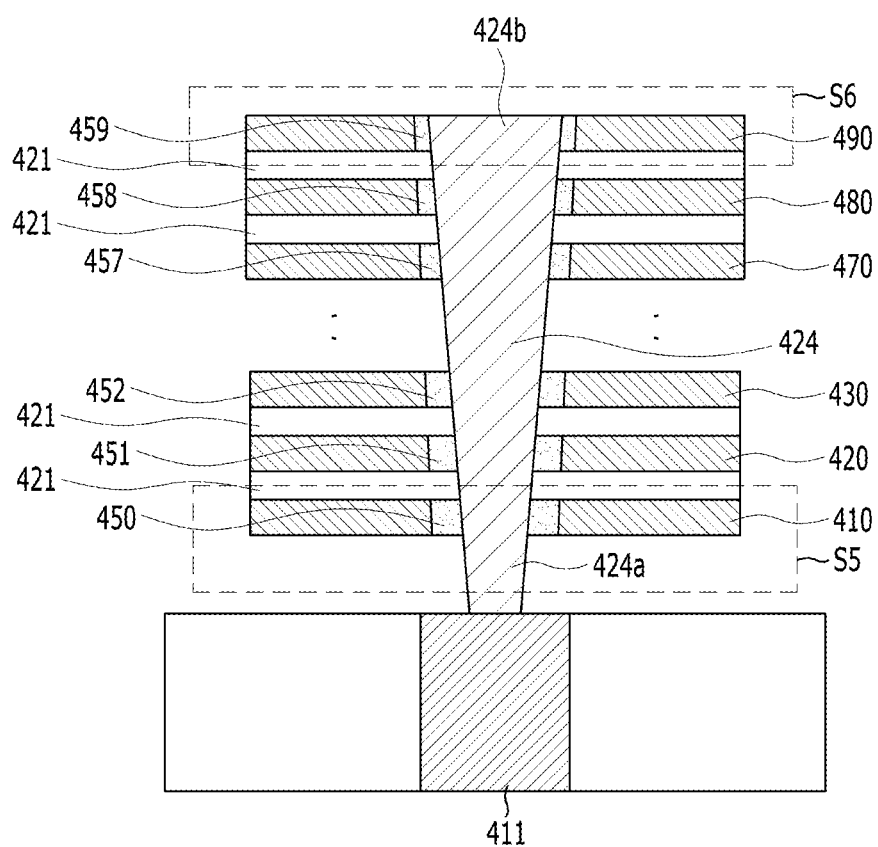
FIG. 5 is a cross-sectional view illustrating a semiconductor memory unit in accordance with another embodiment of the present disclosure.

FIG. 5 is a cross-sectional view illustrating a semiconductor memory unit in accordance with another embodiment of the present disclosure.

The semiconductor memory unit in accordance with the embodiment of FIG. 5 may include a plurality of memory blocks (which correspond to the memory blocks BLK0 to BLKn of FIG. 1) that may extend in first, second, and third directions D1, D2 and D3, similarly to the first embodiment shown in FIG. 2.

The semiconductor memory unit in accordance with the second embodiment of the present disclosure includes a plurality of horizontal electrodes 410 to 490, a vertical electrode 424, a plurality of resistance variable layers 450 to 459 each formed between a corresponding one of the horizontal electrodes 410 to 490 and the vertical electrode 424, a plurality of insulation layers 421 for separating and isolating the horizontal electrodes 410 to 490 and the resistance variable layers 450 to 459 from each other, and a plurality of conductive layers 411. The structures of the horizontal electrodes 410 to 490, the vertical electrode 424, and the conductive layers 411 are similar to the structures of the corresponding features described in the first embodiment of FIG. 2. However, unlike the first embodiment, the resistance variable layers 450 to 459 of the embodiment of FIG. 5 may each be distinct. To be specific, the resistance variable layers 450 to 459 are insulated from each other by the insulation layers 421 in the second direction D2 (that is, vertically), and the resistance variable layers 450 through 459 may include at least a first resistance variable layer having a first thickness and a second resistance variable layer having a second thickness.

When the second resistance variable layer is farther from the conductive layer 411 in the second direction D2 than the first resistance variable layer, the second thickness may be smaller than the first thickness. The conductive layer 411 may transfer an external voltage applied from the outside to the resistance variable layers 450 through 459. For example, when it is assumed that the first resistance variable layer is the resistance variable layer 450 disposed adjacent to the conductive layer 411 and the second resistance variable layer is the resistance variable layer 459 disposed farthest from the conductive layer 411, the first resistance variable layer 450 may be thicker than the second resistance variable layer 459.

Referring to FIG. 5, a first memory cell S5 and a second memory cell S6 are illustrated.

The first memory cell S5 may include a vertical electrode portion 424a formed adjacent to the conductive layer 411, the first horizontal electrode 410 disposed adjacent to the vertical electrode portion 424a, and the first resistance variable layer 450 interposed between the vertical electrode portion 424a and the first horizontal electrode 410 and having the first thickness.

The second memory cell S6 may include a vertical electrode portion 424b formed far from the conductive layer 411, the second horizontal electrode 490 disposed adjacent to the vertical electrode portion 424b, and the second resistance variable layer 459 interposed between the vertical electrode portion 424b and the second horizontal electrode 490 and having the second thickness.

The first resistance variable layer 450 of the first memory cell S5 may be thicker than the second resistance variable layer 459 of the second memory cell S6.

According to the embodiment of the present disclosure described above, a semiconductor memory unit may be provided with improved reliability by forming a resistance variable pattern in different thicknesses according to the position of a voltage supplying end and storing data in the resistance variable pattern using a substantially same level of operation electric field strength across each portion of the resistance variable pattern regardless of the distance between the voltage supplying end and the portion of the resistance variable pattern into which the data is stored.

Herein, the direction that the thickness of the resistance variable pattern increases may be different according to the direction that the operation voltage is applied, as described with reference to FIGS. 3 and 4.

According to the embodiments described above, memory cells of an electronic device may be driven with a uniform operation electric field strength by forming a resistance variable layer in different thicknesses according to a position relative to a voltage supplying end. In this way, reliability of the electronic device may be improved.

The above and other memory circuits or semiconductor devices based on the disclosed technology may be used in a range of devices or systems. FIGS. 6-10 provide some examples of devices or systems that may implement the memory circuits disclosed herein.

Figure 6:
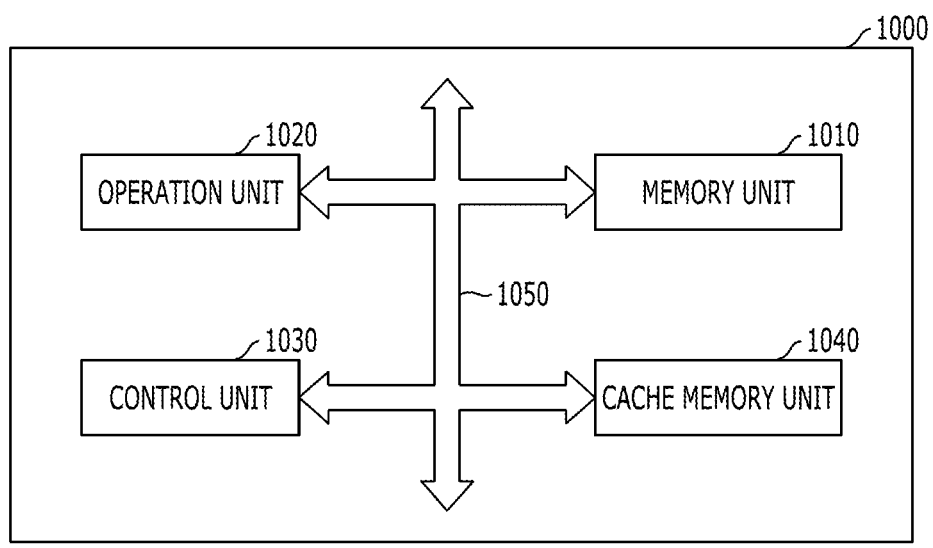
FIG. 6 is an example configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a vertical electrode formed over a substrate and receiving a voltage through one end of the vertical electrode, a resistance variable layer formed along a side of the vertical electrode to be thinner going from one end to the other end, and a plurality of horizontal electrodes formed adjacent to the vertical electrode with the resistance variable layer disposed between the horizontal electrodes and the vertical electrode, and stacked over the substrate with a space from each other. The memory cells of the memory unit 1010 may be driven with a uniform operation electric field strength by forming the resistance variable layer in different thicknesses according to the position of a voltage supplying end. In this way, reliability of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
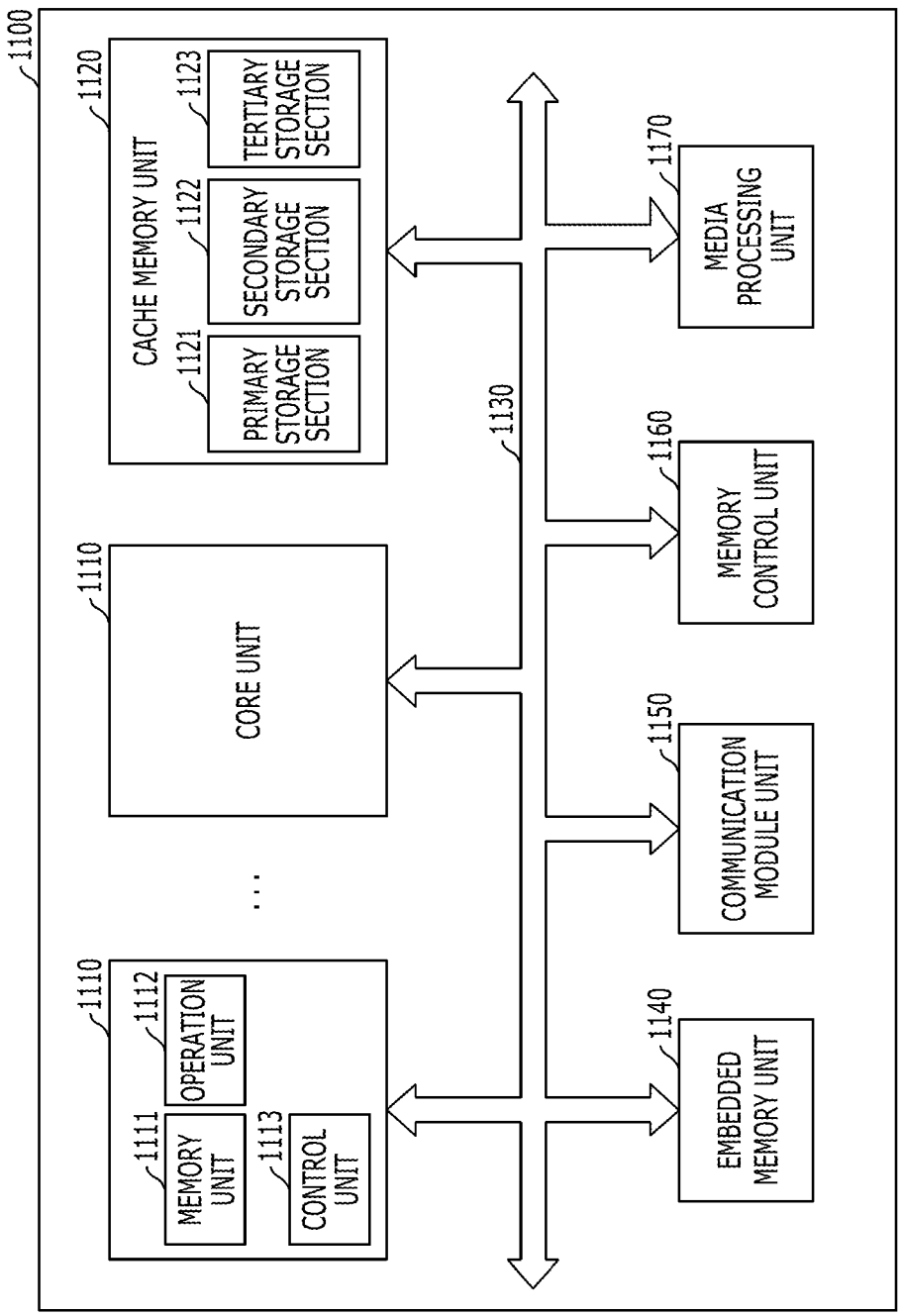
FIG. 7 is an example configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a vertical electrode formed over a substrate and receiving a voltage through one end of the vertical electrode, a resistance variable layer formed along a side of the vertical electrode to be thinner going from one end to the other end, and a plurality of horizontal electrodes formed adjacent to the vertical electrode with the resistance variable layer disposed between the horizontal electrodes and the vertical electrode, and stacked over the substrate with a space from each other. The memory cells of the cache memory unit 1020 may be driven with a uniform operation electric field strength by forming the resistance variable layer in different thicknesses according to the position of a voltage supplying end. In this way, reliability of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
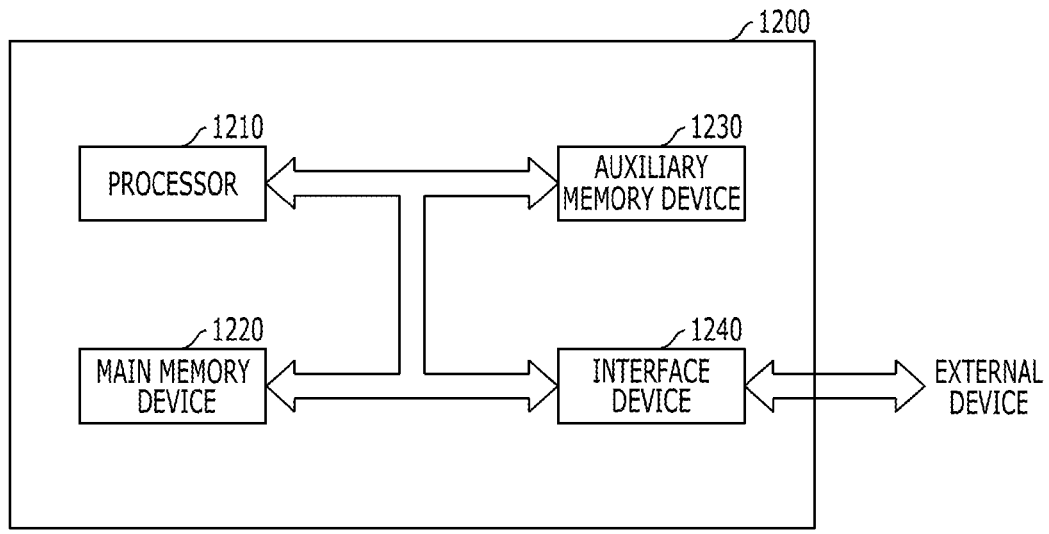
FIG. 8 is an example configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include a vertical electrode formed over a substrate and receiving a voltage through one end of the vertical electrode, a resistance variable layer formed along a side of the vertical electrode to be thinner going from one end to the other end, and a plurality of horizontal electrodes formed adjacent to the vertical electrode with the resistance variable layer disposed between the horizontal electrodes and the vertical electrode, and stacked over the substrate with a space from each other. The memory cells of the main memory device 1020 may be driven with a uniform operation electric field strength by forming the resistance variable layer in different thicknesses according to the position of a voltage supplying end. In this way, reliability of the system 1000 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a vertical electrode formed over a substrate and receiving a voltage through one end of the vertical electrode, a resistance variable layer formed along a side of the vertical electrode to be thinner going from one end to the other end, and a plurality of horizontal electrodes formed adjacent to the vertical electrode with the resistance variable layer disposed between the horizontal electrodes and the vertical electrode, and stacked over the substrate with a space from each other. The memory cells of the auxiliary memory device 1230 may be driven with a uniform operation electric field strength by forming the resistance variable layer in different thicknesses according to the position of a voltage supplying end. In this way, reliability of the system 1200 may be improved.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
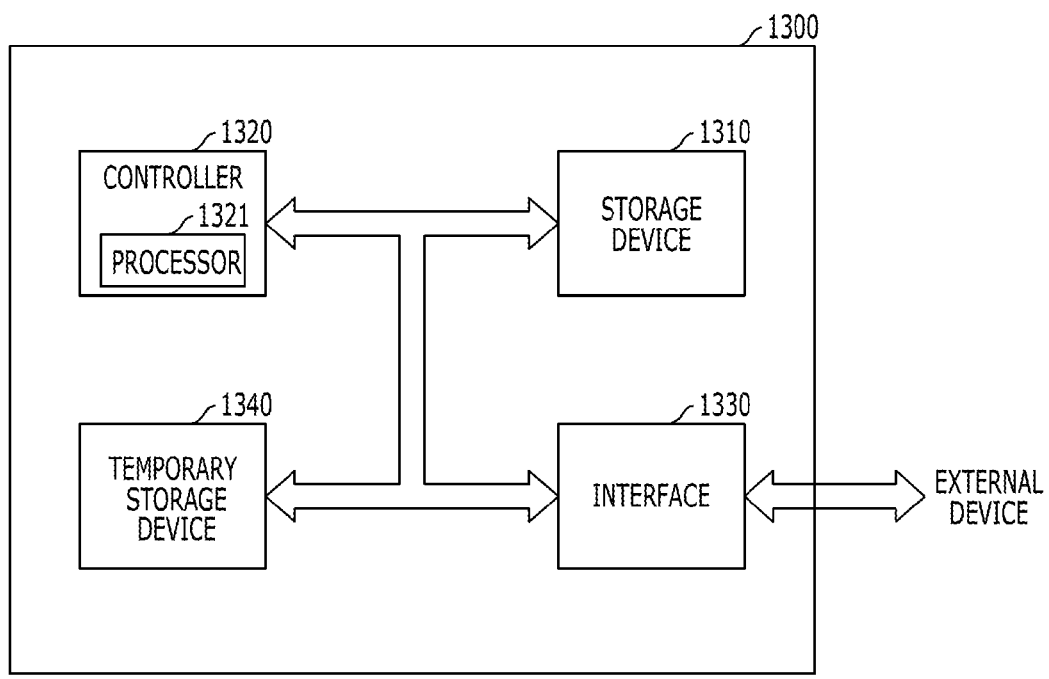
FIG. 9 is an example configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a vertical electrode formed over a substrate and receiving a voltage through one end of the vertical electrode, a resistance variable layer formed along a side of the vertical electrode to be thinner going from one end to the other end, and a plurality of horizontal electrodes formed adjacent to the vertical electrode with the resistance variable layer disposed between the horizontal electrodes and the vertical electrode, and stacked over the substrate with a space from each other. The memory cells of the temporary storage device 1340 may be driven with a uniform operation electric field strength by forming the resistance variable layer in different thicknesses according to the position of a voltage supplying end. In this way, reliability of the data storage system 1300 may be improved.

Figure 10:
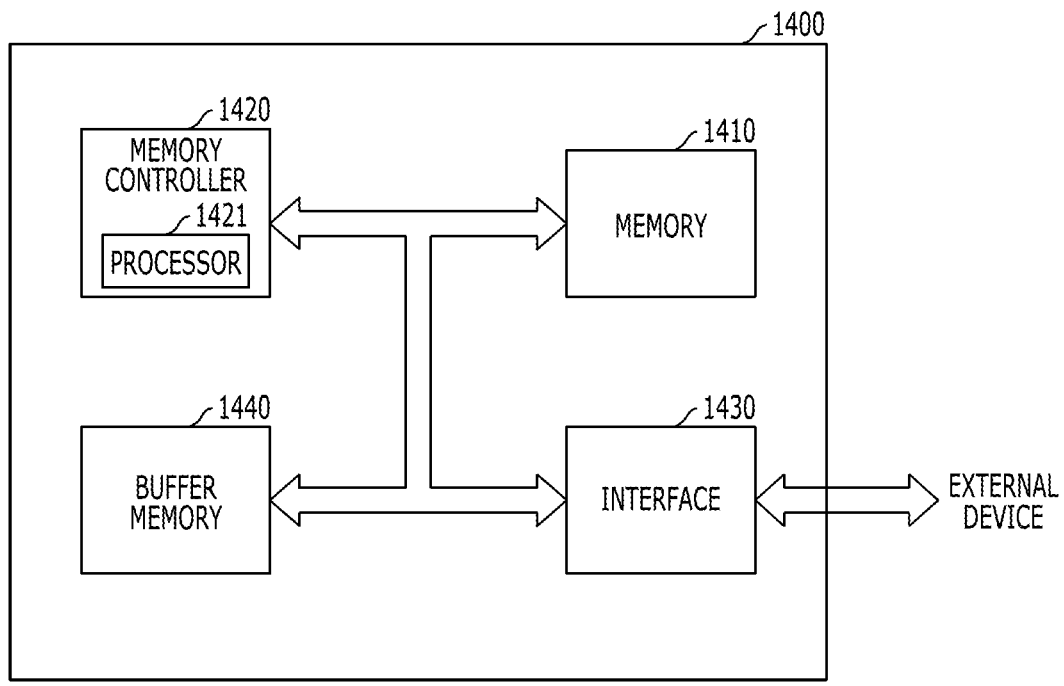
FIG. 10 is an example configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a vertical electrode formed over a substrate and receiving a voltage through one end of the vertical electrode, a resistance variable layer formed along a side of the vertical electrode to be thinner going from one end to the other end, and a plurality of horizontal electrodes formed adjacent to the vertical electrode with the resistance variable layer disposed between the horizontal electrodes and the vertical electrode, and stacked over the substrate with a space from each other. The memory cells of the memory 1410 may be driven with a uniform operation electric field strength by forming the resistance variable layer in different thicknesses according to the position of a voltage supplying end. In this way, reliability of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first magnetic layer pinned in its magnetization direction, a third magnetic layer pinned in its magnetization direction, a second magnetic layer interposed between the first magnetic layer and the third magnetic layer, and changeable in its magnetization direction, a barrier layer interposed between the first magnetic layer and the second magnetic layer, and a dielectric layer interposed between the second magnetic layer and the third magnetic layer. The first magnetic layer has a width 1.5 to 5 times wider than a width of the second magnetic layer.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

According to the embodiments described above, memory cells of an electronic device may be driven with a uniform operation electric field strength by forming a resistance variable layer in different thicknesses according to the position of a voltage supplying end. In this way, reliability of the electronic device may be improved.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments are described. Other embodiments, enhancements and variations can be made based on what is described and illustrated in this patent document.

What is claimed is:

1. An electronic device comprising a semiconductor memory unit, the semiconductor memory unit comprising:
    a first electrode formed over a substrate, having a first end and a second end at a distance in a first direction from the first end, and receiving a voltage through the first end;
    a plurality of resistance variable layers, each formed along a side of the first electrode to be thinner going from the first end to the second end;
    a plurality of second electrodes each formed adjacent to the first electrode and separated from each other along the first direction, a corresponding one of the resistance variable layers being disposed between each second electrode and the first electrode; and
    a plurality of insulation layers, each separating and isolating adjacent second electrodes and adjacent resistance variable layers,
    wherein the adjacent resistance variable layers are insulated from each other by a corresponding one of the plurality of insulation layers.

2. The electronic device of claim 1, wherein the first direction is away from the substrate.

3. The electronic device of claim 1, wherein the first direction is towards the substrate.

4. The electronic device according to claim 1, wherein the resistance variable layer is formed to be a single layer including one selected from the group consisting of a perovskite-based oxide, a transition metal oxide, and a chalcogenide compound, or a multi-layer thereof.

5. The electronic device according to claim 1, wherein the semiconductor memory unit further comprises:
    a conductive layer electrically coupled to the first end of the first electrode and applying the voltage to the first electrode.

6. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that occurs when the control unit decodes the command; and
    a memory unit configured to store data for performing the operation, data corresponding to a result of performing the operation, or an address of data for which the operation is performed,
    wherein the semiconductor memory unit is part of the memory unit in the microprocessor.

7. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory unit that is part of the cache memory unit in the processor.

8. The electronic device according to claim 1, further comprising a processing system which includes:
- a processor configured to decode a command received by the processor and control an operation for information based on a result of decoding the command;
- an auxiliary memory device configured to store a program for decoding the command and the information;
- a main memory device configured to call and store the program and the information from the auxiliary memory device such that the processor can perform the operation using the program and the information when executing the program; and
- an interface device configured to perform communication between at least one of the processor, the auxiliary memory device and the main memory device and the outside,
- wherein the semiconductor memory unit is part of the auxiliary memory device or the main memory device in the processing system.

9. The electronic device according to claim 1, further comprising a data storage system which includes:
- a storage device configured to store data and conserve stored data regardless of power supply;
- a controller configured to control input and output of data to and from the storage device according to a command inputted from an outside;
- a temporary storage device configured to temporarily store data exchanged between the storage device and the outside; and
- an interface configured to perform communication between at least one of the storage device, the controller and the temporary storage device and the outside,
- wherein the semiconductor memory unit is part of the storage device or the temporary storage device in the data storage system.

10. The electronic device according to claim 1, further comprising a memory system which includes:
- a memory configured to store data and conserve stored data regardless of power supply;
- a memory controller configured to control input and output of data to and from the memory according to a command inputted from an outside;
- a buffer memory configured to buffer data exchanged between the memory and the outside; and
- an interface configured to perform communication between at least one of the memory, the memory controller and the buffer memory and the outside,
- wherein the semiconductor memory unit that is part of the memory or the buffer memory in the memory system.

11. An electronic device comprising a semiconductor memory unit, the semiconductor memory unit comprising:
- a first electrode formed over a substrate, having a first portion and a second portion at a distance in a first direction from the first portion, and receiving a voltage through the first portion;
- a second electrode disposed adjacent to the first portion of the first electrode;
- a third electrode disposed adjacent to the second portion of the first electrode;
- a first resistance variable layer interposed between the first electrode and the second electrode and having a first thickness;
- a second resistance variable layer interposed between the first electrode and the third electrode and having a second thickness that is smaller than the first thickness; and
- an insulation layer separating and isolating the second electrode and the first resistance variable layer from the third electrode and the second resistance variable layer,
- wherein the first resistance variable layer is insulated from the second resistance variable layer by the insulation layer.

12. The electronic device according to claim 11, wherein the first direction is orthogonal to the substrate, and the second and third electrodes are formed substantially parallel to the substrate.

13. The electronic device according to claim 11, wherein each of the first and second resistance variable layers is formed to be a single layer including one selected from the group consisting of a perovskite-based oxide, a transition metal oxide, and a chalcogenide compound, or a multi-layer thereof.

14. The electronic device according to claim 11, wherein the semiconductor memory unit further comprises:
- a conductive layer formed to be coupled with the first end of the first electrode and applying the voltage to the first electrode.

15. The electronic device of claim 1, wherein each of the plurality of second electrodes has top and bottom surfaces that are respectively coplanar with top and bottom surfaces of the corresponding one of the resistance variable layers.

16. The electronic device of claim 11, wherein the second electrode has top and bottom surfaces that are respectively coplanar with top and bottom surfaces of the first resistance variable layers, and
- wherein the third electrode has top and bottom surfaces that are respectively coplanar with top and bottom surfaces of the second resistance variable layers.

* * * * *